US008532882B2

(12) United States Patent
Akiyama

(10) Patent No.: US 8,532,882 B2
(45) Date of Patent: Sep. 10, 2013

(54) OCCUPANT RESTRAINT DEVICE CONTROL DEVICE

(75) Inventor: Kentaro Akiyama, Yokohama (JP)

(73) Assignee: Autoliv Development AB, Vargarda (SE)

( * ) Notice: Subject to any disclaimer, the term of this patent is extended or adjusted under 35 U.S.C. 154(b) by 185 days.

(21) Appl. No.: 13/257,422

(22) PCT Filed: Mar. 16, 2010

(86) PCT No.: PCT/JP2010/054435
§ 371 (c)(1),
(2), (4) Date: Sep. 19, 2011

(87) PCT Pub. No.: WO2010/107025
PCT Pub. Date: Sep. 23, 2010

(65) Prior Publication Data
US 2012/0010784 A1  Jan. 12, 2012

(30) Foreign Application Priority Data

Mar. 19, 2009  (JP) ................................. 2009-068497

(51) Int. Cl.
B60R 21/013 (2006.01)
G06F 19/00 (2011.01)
(52) U.S. Cl.
USPC .................. 701/45; 701/1; 180/446; 60/634
(58) Field of Classification Search
USPC .................. 701/45, 1, 36; 180/446; 60/634; 343/700 M; 365/174
See application file for complete search history.

(56) References Cited

U.S. PATENT DOCUMENTS 6,301,892 B1 * 10/2001 Narumi et al. .................. 60/634
6,843,344 B2 * 1/2005 Kodama et al. ............... 180/446

FOREIGN PATENT DOCUMENTS

| JP | 2000 033848 | 2/2000 |
| JP | 2003-260992 | 9/2003 |
| JP | 2005-064938 | 3/2005 |
| JP | 2006-319854 | 11/2006 |

OTHER PUBLICATIONS

English Translation of International Search Report for PCT/JP2010/054435, Mailed Jun. 1, 2010, one page.

* cited by examiner

*Primary Examiner* — Tan Q Nguyen
(74) *Attorney, Agent, or Firm* — Brinks Hofer Gilson & Lione

(57) ABSTRACT

An occupant restraint device controller, including an electronic circuit substrate incorporating therein a control circuit that determines whether or not a vehicle has collided based on a detection output of a sensor detecting acceleration/deceleration of the vehicle and outputs a control signal for activating an occupant restraint tool. The electronic circuit substrate is accommodated inside a resin case provided with a structure for leading out a ground electrode from the inside to the outside of the resin case. The structure for leading out a ground electrode is configured such that a fixing leg, for fixing the electronic circuit substrate, is provided inside the case. This fixing leg is connected to a mounting portion, to be mounted to the vehicle, via a ground lead-out member that includes a first spring structure held between the fixing leg and the electronic circuit substrate, a ground terminal held between the case and part of the vehicle, and a second spring structure connecting the first spring structure to the ground terminal.
As a result, grounding and sensor performance similar to that of conventional counterparts is achieved while a resin case is employed.

4 Claims, 3 Drawing Sheets (a)

(b)

(c)

OCCUPANT RESTRAINT DEVICE CONTROL DEVICE

BACKGROUND

1. Field of the Invention

The present invention relates to an occupant restraint device controller for electrically controlling activation of an occupant restraint device installed in an automobile as a safety device.

2. Related Technology

An air bag device, for example, which deploys an air bag with gas to restrain an occupant in the event of a collision to thereby protect the occupant from the impact of the collision, is electrically controlled for deployment by an air bag controller.

This air bag controller is configured to include a sensor for detecting acceleration or deceleration and an electronic circuit substrate incorporating therein a control circuit that determines whether or not the vehicle has collided based on the detection output of the sensor and to output a control signal for deployment of the air bag.

The case that accommodates the above-mentioned electronic circuit substrate therein has conventionally been made of metal, such as die cast aluminum, in order to secure reliability (for example, Japanese Patent Application Laid-open No. 2000-33848). However, the demand for weight reduction has increased in recent years in response to the increased awareness of environmental issues, because of which the case is now desired to be made of resin.

The case typically has a structure that allows the electronic circuit substrate to be grounded to the outside for stabilization of the electronic equipment. If, however, the case is made of resin, the case cannot be grounded. Therefore, grounding performance similar to that of the conventional counterpart needs to be provided, using a separate component.

The problem to be solved by the present invention is that, if the case is made of resin in response to the demand for weight reduction, such case cannot be grounded, because of which grounding performance similar to that of the conventional counterpart needs to be provided, using a separate component.

SUMMARY OF THE INVENTION

The occupant restraint device controller of the present invention employs the following configuration in order to provide grounding performance similar to that of the conventional counterpart even if the case is made of resin.

Namely, the most primary characteristic of the occupant restraint device controller of the present invention is that it includes; a sensor detecting acceleration or deceleration of a vehicle; and an electronic circuit substrate incorporating therein a control circuit that determines whether or not the vehicle has collided based on a detection output of this sensor and outputs a control signal for activating an occupant restraint tool, wherein the electronic circuit substrate is accommodated inside a resin case provided with a structure for leading out a ground electrode from inside to outside, and the structure for leading out a ground electrode is configured such that a fixing leg for fixing the electronic circuit substrate is provided inside the case, this fixing leg being connected to a mounting portion to be mounted to the vehicle, via a ground lead-out member including a first spring structure held between the fixing leg and the electronic circuit substrate, a ground terminal held between the case and part of the vehicle, and a second spring structure in a bent shape connecting the first spring structure and the ground terminal.

According to one aspect of the present invention, the electronic circuit substrate is accommodated in the resin case provided with the structure for leading out a ground electrode from inside to outside, so that grounding performance similar to that of the conventional counterpart can be provided even if a resin case is employed in an attempt to reduce weight.

Further, according to another aspect of the present invention, the ground lead-out member includes the first spring structure held between the fixing leg and the electronic circuit substrate, the ground terminal held between the case and part of the vehicle, and the second spring structure in a bent shape connecting the first spring structure and the ground terminal, so that any secular changes that may develop in a mounting portion of the ground lead-out member can be absorbed.

According to a further aspect of the present invention, grounding performance similar to that of the conventional counterpart can be provided even if a resin case is employed for weight reduction, by providing a structure in the case for leading out a ground electrode from inside to outside.

Accordingly, the need for sensor performance equivalent to that of the conventional counterpart is satisfied, and the weight reduction of the sensor leads to a reduction in vehicle weight, as a result of which fuel economy of the vehicle can be improved.

BRIEF DESCRIPTION OF THE DRAWINGS

FIG. 3(c) is a longitudinal cross-sectional view of a mounting portion to be mounted to the vehicle.

DETAILED DESCRIPTION

The present invention provides grounding performance similar to that of the conventional counterpart even when a resin case is employed for weight reduction, by providing a structure to the case for leading out a ground electrode from the inside to the outside of the case.

Figure 1:
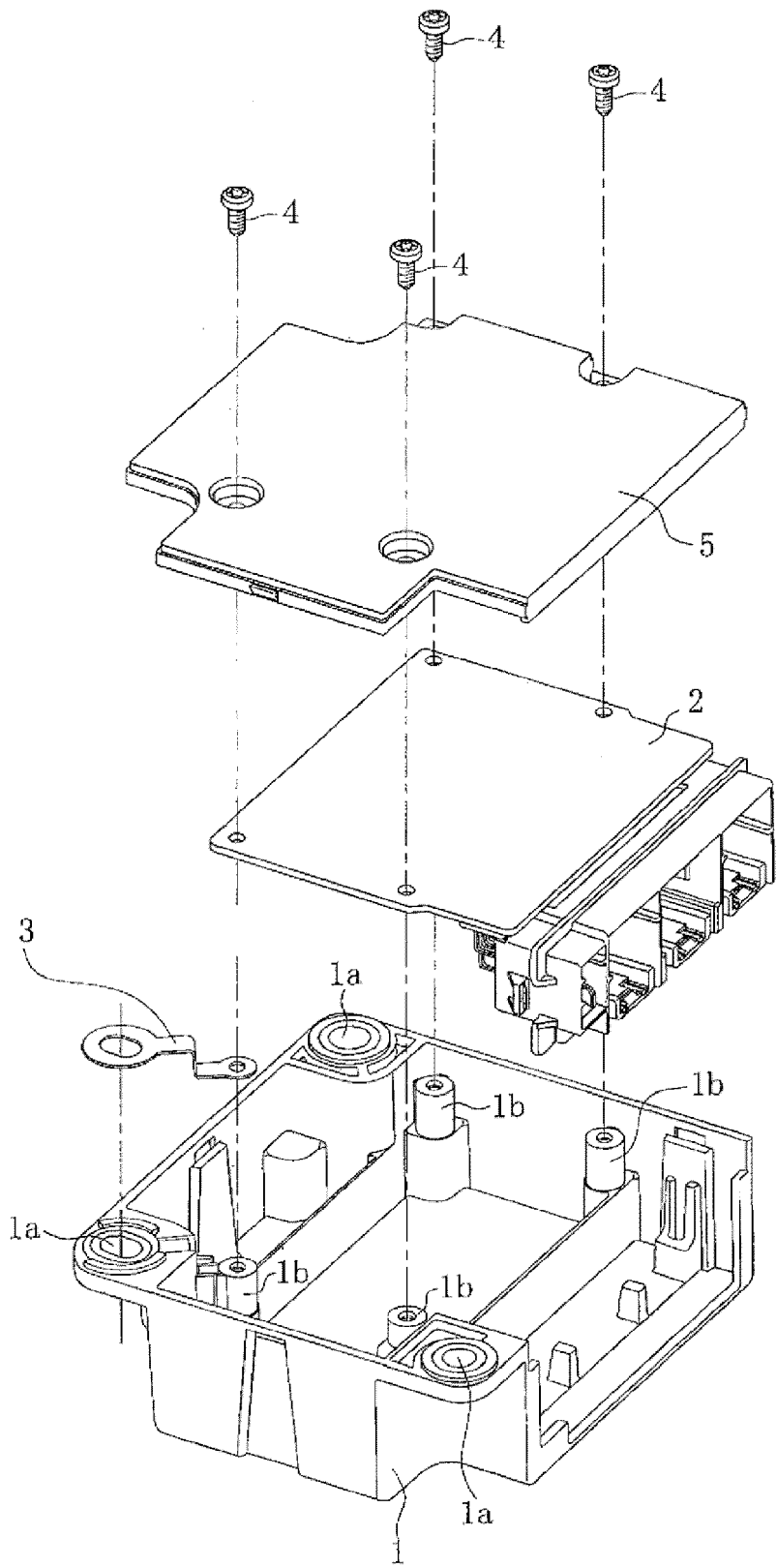
FIG. 1 is an exploded perspective view of an occupant restraint device controller embodying the principles of the present invention.
Figure 2:
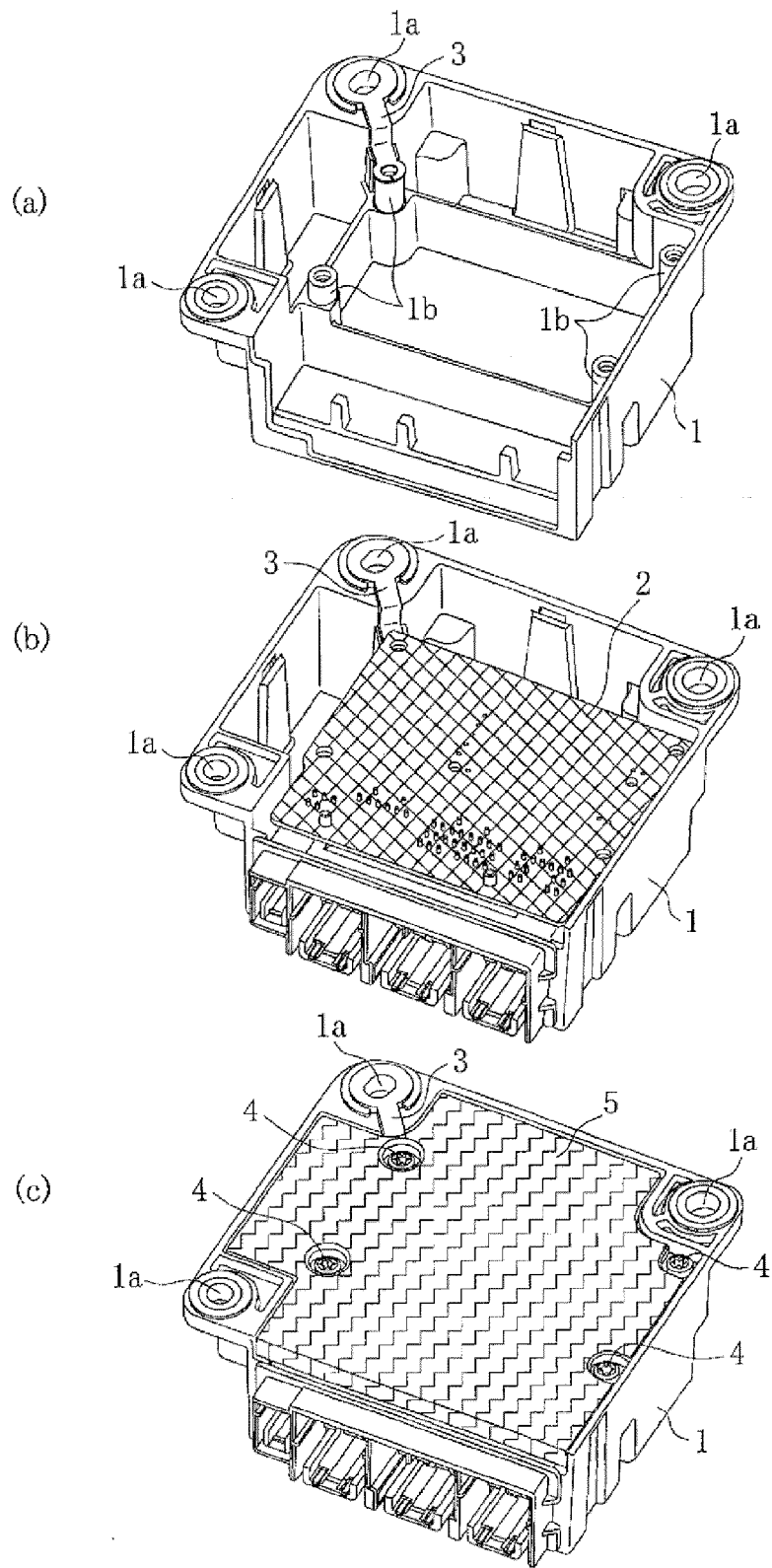
FIG. 2(a) to FIG. 2(c) show the basic parts of the occupant restraint device controller in the assembling order, with FIG. 2(a) showing a state in which a ground lead-out member is mounted to the case, FIG. 2(b) showing a state in which an electronic circuit substrate is mounted in addition to the state FIG. 2(a), and FIG. 2(c) showing a state in which a cover is mounted in addition to the state FIG. 2(b)
Figure 3:
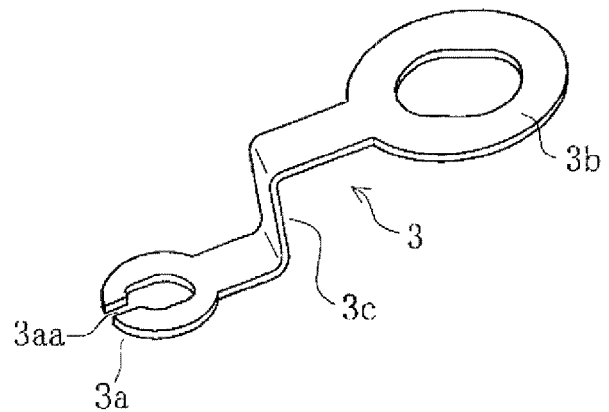
FIG. 3(a) to FIG. 3(c) are diagrams for explaining the ground lead-out member, with FIG. 3(a) being a perspective view, FIG. 3(b) being a longitudinal cross-sectional view of a portion where the ground lead-out member is mounted to a fixing leg.
Figure 3:
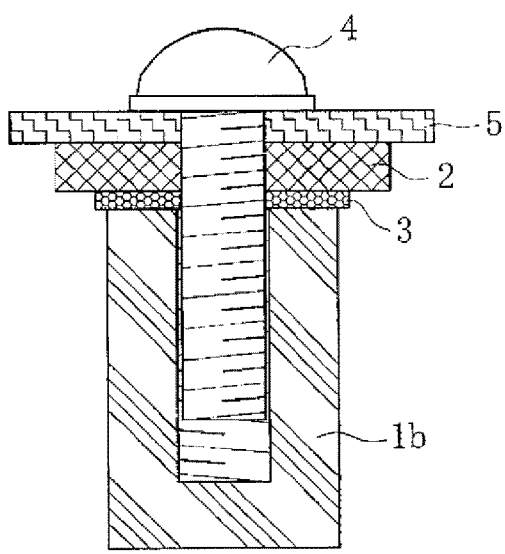
Figure 3:
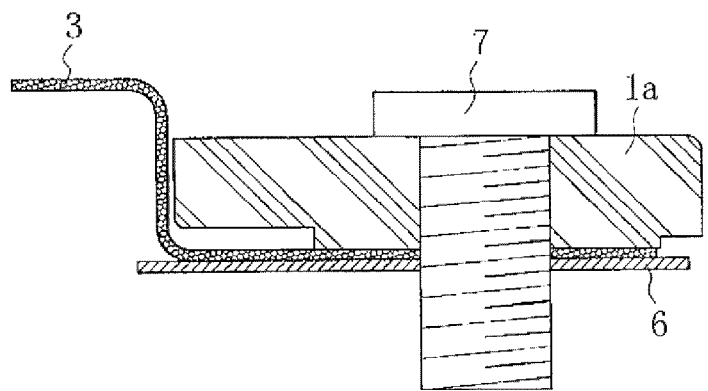

Exemplary embodiments for carrying out the present invention will be hereinafter described using FIG. 1 to FIG. 3.

Reference numeral 1 denotes a resin case, which has a box-like shape with the top and one side wall open, and is provided with vehicle mounting portions 1a at three corners, for example, on the outer circumference of the top opening. In order that an electronic circuit or component substrate 2 incorporating therein a control circuit for outputting a control signal to deploy an air bag, for example, can be accommodated, fixing legs 1b for fixing the electronic component substrate 2 are provided at four corners inside this case 1.

Reference numeral 3 denotes a ground lead-out member, for leading out a ground electrode from the inside of the case 1 to the outside of the case 1, which connects one of the mounting portions 1a and one of the fixing legs 1b of the case 1 (see FIG. 2(a)).

This ground lead-out member 3 is made up of a first spring structure 3a, a ground terminal 3b and a second spring structure 3c. The first spring structure 3a is the portion to be mounted to the fixing leg 1b. The ground terminal 3b is the portion to be mounted to the vehicle 6. The second spring structure 3c connects the first spring structure 3a to the ground terminal 3b.

Of these, the first spring structure 3a has a configuration in which, for example as shown in FIG. 3(a), part thereof is cut out with a slit, and a step is formed to this cut-out portion 3aa. The first spring structure is mounted such as to be held between the fixing leg 1b and the electronic circuit substrate 2, as shown in FIG. 3(b), with a screw 4. In this way, this spring structure enables grounding strength of the electronic circuit substrate 2 to be maintained even if the case 1 reduces in size due to changes over time. Reference numeral 5 denotes a cover attached on top of the electronic circuit substrate 2.

The ground terminal 3b, on the other hand, does not employ the cut-out portion 3aa of the first spring structure 3a. Therefore, as it is mounted with a bolt 7 such as to be held between the mounting portion 1a and part of the vehicle 6 as shown in FIG. 3(c), this mounting portion cannot absorb changes over time of the case 1.

However, since the portion connecting the first spring structure 3a and the ground terminal 3b is formed in a bent shape to have a spring structure (second spring structure 3c), this second spring structure 3c enables grounding strength of the electronic circuit substrate 2 to be maintained even if the case 1 reduces in size due to changes over time.

Namely, according to the present invention, with the effect of the first spring structure 3a and the second spring structure 3c of the ground lead-out member 3, stabilization of the electronic equipment can be ensured even if the resin case 1 is employed in an attempt to reduce weight.

Described below is the results of a constant temperature humidity test (ambient temperature: 85° C., humidity: 85%, 1000 hours) carried out to prove that the above-described present invention exhibits electronic equipment stabilizing performance equivalent to that of conventional products that employ aluminum die cast cases.

Table 1 below shows the contact resistance before the constant temperature humidity test, and Table 2 shows the contact resistance after the constant temperature humidity test, of products embodying the principles of the present invention and products of conventional construction. In a first embodiment of the present invention, designated as invention product 1 in Tables 1 and 2, fixing was achieved with screws as shown in the accompanying drawings, while in a second embodiment of the present invention, designated as invention product 2, attachment with the fixing legs was achieved by thermal bonding. The conventional product 1 was grounded at four points, while the conventional product 2 was grounded at five points.

TABLE 1

|  | Portion mounted to fixing leg | Portion mounted to vehicle |
| --- | --- | --- |
| Invention product 1 | 0.010 | 0.017 |
| Invention product 2 | 0.015 | 0.010 |
| Conventional product 1 | 0.012 | 0.012 |
| Conventional product 2 | 0.010 | 0.012 |

(unit: Ω)

TABLE 2

|  | Portion mounted to fixing leg | Portion mounted to vehicle |
| --- | --- | --- |
| Invention product 1 | 0.010 | 0.015 |
| Invention product 2 | 0.003 | 0.015 |
| Conventional product 1 | 0.010 | 0.060 |
| Conventional product 2 | 0.001 | 1.850 |

(unit: Ω)

From Tables 1 and 2 above, it was proved that the resistance did not change much before and after the test in both of the present invention products 1 and 2 and the conventional products 1 and 2, and that there was no difference in resistance between the present invention products 1 and 2 and the conventional products 1 and 2. Thus it can be seen that the present invention can exhibit electronic equipment stabilizing performance equivalent to that of conventional counterparts that employ metal cases.

The present invention is not restricted to the above-described example and the embodiment may be changed suitably as long as such changes are made within the scope of technical ideas described in the claims.

Namely, the occupant restraint device controller described in the foregoing is a preferred example of the present invention, and other embodiments than the above can be worked out or carried out in various manners. Unless otherwise expressed herein to the contrary, the present invention should not be restricted to the shape, size, and configuration/layout and the like of particular components shown in the accompanying drawings. The expressions and terms used herein are for illustrative purposes only and not meant to be limiting unless otherwise expressed to the contrary.

For example, attachment to the fixing leg 1b is not restricted to by way of screws 4 as described with reference to FIG. 3, but may be achieved by thermal bonding as with the invention product example 2.

The present invention described above is effective for any cases, not only of a device for controlling deployment of an airbag, but of a device for controlling restraint with a seatbelt or the like, as long as the case accommodates equipment that needs to be grounded.

I claim:

1. An occupant restraint device controller, comprising:
a sensor detecting acceleration or deceleration of a vehicle; and
an electronic circuit substrate incorporating therein a control circuit that determines whether or not the vehicle has collided based on a detection output of this sensor and outputs a control signal for activating an occupant restraint tool,
a resin case, the resin case housing the electronic circuit substrate,
a ground lead-out member, the ground lead out member connecting a ground electrode of the electronic circuit substrate located inside of the resin case to a location outside of the resin case,
the resin case includes a fixing leg for fixing the electronic circuit substrate inside the case,
the ground lead-out member is provided as an independent part from the resin case, the ground lead-out member further comprising a first spring structure, a ground terminal and a second spring structure, the first spring structure being held between the fixing leg and the electronic circuit substrate, the ground terminal being held between the case and part of the vehicle, and the second spring structure having a bent shape and connecting the first spring structure and the ground terminal, wherein the ground lead-out member is configured such that the ground electrode of the electronic circuit substrate is electrically connected from the first spring structure fixed to the fixing leg located inside of the resin case to the ground terminal fixed to a portion of the vehicle.

2. The occupant restraint device controller according to claim 1, wherein a portion of the first spring structure defines a cut-out section, wherein the portion defining the cut-out section has ends off-set from each other.

3. The occupant restraint device controller according to claim 1, wherein a portion of the first spring structure defines a cut-out section, wherein the portion defining the cut-out section has ends that are uneven with one another.

4. The occupant restraint device controller according to claim 1, wherein a portion of the first spring structure defines a cut-out section, wherein the portion defining the cut-out section has ends that are different from one another.

* * * * *